(12) United States Patent
Lu et al.

(10) Patent No.: US 11,715,323 B2
(45) Date of Patent: Aug. 1, 2023

(54) FINGERPRINT SENSING DEVICE

(71) Applicant: Au Optronics Corporation, Hsinchu (TW)

(72) Inventors: Shih-Hua Lu, Hsinchu (TW); Chao-Chien Chiu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 0 days.

(21) Appl. No.: 17/715,962

(22) Filed: Apr. 8, 2022

(65) Prior Publication Data

US 2022/0375251 A1    Nov. 24, 2022

Related U.S. Application Data

(60) Provisional application No. 63/189,960, filed on May 18, 2021.

(30) Foreign Application Priority Data

Oct. 12, 2021   (TW) ................................. 110137679

(51) Int. Cl.
*G06F 3/042*    (2006.01)
*G06V 40/13*    (2022.01)
(Continued)

(52) U.S. Cl.
CPC ...... *G06V 40/1318* (2022.01); *G02F 1/13338* (2013.01); *G02F 1/133512* (2013.01);
(Continued)

(58) Field of Classification Search
CPC ............ G06V 40/1318; G06V 40/1324; G02F 1/13338; G02F 1/133512; G02F 1/133526;
(Continued)

(56) References Cited

U.S. PATENT DOCUMENTS

| 10,665,631 B1 | 5/2020 | Cai et al. |
| 2021/0004558 A1 | 1/2021 | Zeng et al. |

(Continued)

FOREIGN PATENT DOCUMENTS

| CN | 109445161 | 3/2019 |
| CN | 110796123 | 2/2020 |

(Continued)

*Primary Examiner* — Abdul-Samad A Adediran
(74) *Attorney, Agent, or Firm* — JCIPRNET

(57) ABSTRACT

A fingerprint sensing device includes a first substrate, a sensing element layer, a second substrate, a micro-structure layer, and a spacer layer. The sensing element layer is located on the first substrate and includes multiple sensing elements. The second substrate is located on the sensing element layer. The micro-structure layer is located between the second substrate and the sensing element layer, and includes multiple micro-lens structures and multiple dummy structures. Orthogonal projections of the micro-lens structures on the first substrate overlap orthogonal projections of the sensing elements on the first substrate. The spacer layer is located between the second substrate and the sensing element layer, and includes multiple main spacers. Each of the main spacers covers at least one of the dummy structures.

17 Claims, 18 Drawing Sheets

(51) Int. Cl.
  *G02F 1/1333* (2006.01)
  *G02F 1/1335* (2006.01)
  *H01L 27/146* (2006.01)
  *H10K 39/32* (2023.01)

(52) U.S. Cl.
  CPC ........ *G02F 1/133526* (2013.01); *G06F 3/042* (2013.01); *G06V 40/1324* (2022.01); *H01L 27/14621* (2013.01); *H01L 27/14623* (2013.01); *H01L 27/14627* (2013.01); *H01L 27/14678* (2013.01); *H10K 39/32* (2023.02); *G02F 2201/56* (2013.01)

(58) Field of Classification Search
  CPC ........... G02F 2201/56; H01L 27/14621; H01L 27/14623; H01L 27/14627; H01L 27/14678; H01L 27/307
  See application file for complete search history.

(56) References Cited

U.S. PATENT DOCUMENTS

| | | | |
|---|---|---|---|
| 2021/0151511 A1* | 5/2021 | Kim | G06F 3/042 |
| 2021/0366961 A1* | 11/2021 | Yanagita | H01L 27/14621 |
| 2022/0050987 A1 | 2/2022 | Chiu et al. | |

FOREIGN PATENT DOCUMENTS

| | | |
|---|---|---|
| CN | 211787149 | 10/2020 |
| CN | 111967417 | 11/2020 |
| CN | 212411211 | 1/2021 |
| CN | 112712039 | 4/2021 |

* cited by examiner

FINGERPRINT SENSING DEVICE

CROSS-REFERENCE TO RELATED APPLICATION

This application claims the priority benefits of U.S. provisional application Ser. No. 63/189,960, filed on May 18, 2021, and Taiwanese application serial no. 110137679, filed on Oct. 12, 2021. The entirety of each of the above-mentioned patent applications is hereby incorporated by reference herein and made a part of this specification.

BACKGROUND

Technical Field

The disclosure relates to a sensing device, and in particular to a fingerprint sensing device.

Description of Related Art

In order to build a smart living environment, sensing technology has been widely used in various electronic devices. For example, devices such as cell phones and electronic locks use fingerprint sensors to protect personal data security and access control. For practical applications, fingerprint sensors need to be designed with light collimation to overcome the problem of light reflection from adjacent peaks/valleys of the fingerprint. However, during the fingerprint pressure test, it was found that the uneven finger pressure resulted in uneven air gap and micro lens crushing, which further caused the optical focus point variation and light acceptance angle variation, resulting in poor sensing resolution.

SUMMARY

The disclosure provides a fingerprint sensing device with improved sensing resolution.

An embodiment of the disclosure proposes a fingerprint sensing device including: a first substrate; a sensing element layer located on the first substrate and including multiple sensing elements; a second substrate located on the sensing element layer; a micro-structure layer located between the second substrate and the sensing element layer, and including multiple micro-lens structures and multiple dummy structures, in which orthogonal projections of the micro-lens structures on the first substrate respectively overlap orthogonal projections of the sensing elements on the first substrate; and a spacer layer located between the second substrate and the sensing element layer, and including multiple main spacers, in which each of the main spacers covers at least one of the dummy structures.

In an embodiment of the disclosure, the micro-structure layer and the spacer layer are disposed on the first substrate.

In an embodiment of the disclosure, the micro-structure layer and the spacer layer are disposed on the second substrate.

In an embodiment of the disclosure, a height of the main spacer is greater than 10 μm.

In an embodiment of the disclosure, the spacer layer further includes multiple bumps, and the main spacers are located between the bumps and the dummy structures.

In an embodiment of the disclosure, the spacer layer further includes multiple sub-spacers, each of the sub-spacers covers at least one of the dummy structures, and a height of the sub-spacer is smaller than a height of the main spacer.

In an embodiment of the disclosure, the spacer layer further includes multiple bumps, and the main spacers and the sub-spacers are respectively located between the bumps and the dummy structures.

In an embodiment of the disclosure, an orthogonal projection of the dummy structure on the first substrate is outside the orthogonal projection of the sensing element on the first substrate.

In an embodiment of the disclosure, the fingerprint sensing device further includes a light shielding layer located between the sensing element layer and the micro-structure layer.

In an embodiment of the disclosure, the light shielding layer has multiple openings, and orthogonal projections of the openings on the first substrate respectively overlap the orthogonal projections of the sensing elements on the first substrate.

In an embodiment of the disclosure, the spacer layer further includes a peripheral spacer.

An embodiment of the disclosure proposes a fingerprint sensing device comprising: a first substrate; a sensing element layer located on the first substrate and including multiple sensing elements; a second substrate located on the sensing element layer; a micro-structure layer located between the second substrate and the sensing element layer, and including multiple micro-lens structures and multiple dummy structures; and a spacer layer located on one side of the micro-structure layer, and including multiple main spacers and multiple sub-spacers, in which each of the main spacers and each of the sub-spacers respectively overlap at least one of the dummy structures, and a height of the sub-spacer is smaller than a height of the main spacer.

In an embodiment of the disclosure, the micro-structure layer is disposed on the first substrate, and the spacer layer is disposed on the second substrate.

In an embodiment of the disclosure, the micro-structure layer is disposed on the second substrate, and the spacer layer is disposed on the first substrate.

In an embodiment of the disclosure, orthogonal projections of the micro-lens structures on the first substrate respectively overlap orthogonal projections of the sensing elements on the first substrate.

In an embodiment of the disclosure, an orthogonal projection of the dummy structure on the first substrate is outside the orthogonal projection of the sensing element on the first substrate.

In an embodiment of the disclosure, the second substrate is a color filter substrate.

To make the aforementioned more comprehensible, several embodiments accompanied with drawings are described in detail as follows.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
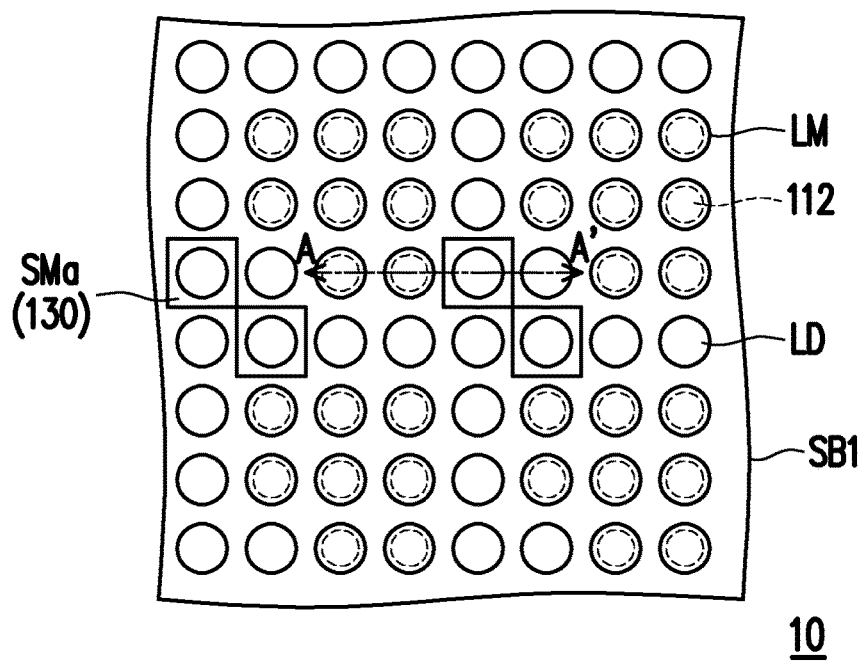
FIG. 1A is a schematic partial top view of a fingerprint sensing device 10 according to an embodiment of the disclosure.

In the drawings, the thickness of layers, films, panels, regions, etc., are enlarged for clarity. The same reference numerals refer to the same elements throughout the specification. It should be understood that when an element such as a layer, film, region, or substrate is referred to as being "on" or "connected to" another element, it can be directly on or connected to the other element, or an intermediate element may also be present. In contrast, when an element is referred to as being "directly on" or "directly connected to" another element, there are no intermediate elements present. As used herein, "connected" may refer to a physical and/or electrical connection. Furthermore, "electrically connected" or "coupled" may refer to the existence of other elements between the two elements.

It should be understood that, although the terms "first", "second", "third", etc. may be used herein to describe various elements, components, regions, layers and/or sections, these elements, components, regions, layers and/or sections shall not be limited by these terms. These terms are only used to distinguish one element, component, region, layer or section from another element, component, region, layer, or section. Thus, a first "element," "component," "region," "layer" or "section" discussed below could be termed a second element, component, region, layer, or section without departing from the teachings herein.

The terminology used herein is for the purpose of describing particular embodiments only and is not limiting. As used herein, the singular forms "a," "an," and "the" are intended to include the plural forms including "at least one" or mean "and/or" unless the content clearly dictates otherwise. As used herein, the term "and/or" includes any and all combinations of one or more of the associated listed items. It should also be understood that when used in this specification, the terms "include" and/or "comprise" designate the presence of stated features, regions, wholes, steps, operations, elements and/or components, but do not exclude the presence or addition of one or more other features, regions, wholes, steps, operations, elements, components and/or combinations thereof.

Furthermore, relative terms such as "lower" or "bottom" and "upper" or "top" may be used herein to describe one element's relationship to another element, as shown in the figures. It should be understood that relative teens are intended to encompass different orientations of the device in addition to the orientation shown in the figures. For example, if the device in one of the figures is turned over, elements described as being on the "lower" side of other elements would then be oriented on "upper" sides of the other elements. Thus, the exemplary term "lower" may include an orientation of "lower" and "upper", depending on the particular orientation of the figures. Similarly, if the device in one of the figures is turned over, elements described as "below" or "beneath" other elements would then be oriented "above" the other elements. Thus, the exemplary terms "below" or "beneath" can encompass an orientation of above and below.

Considering the particular amount of measurement and measurement-related error discussed (i.e., the limitations of the measurement system), "about," "approximately," or "substantially" as used herein includes the average of the stated value and an acceptable range of deviations from the particular value as determined by those skilled in the art. For example, "about" can mean within one or more standard deviations of the stated value, or within ±30%, ±20%, ±10%, +5%. Furthermore, the terms "about", "approximately", or "substantially" as used herein can be chosen from a range of acceptable deviations or standard deviations depending on the optical properties, etching properties, or other properties, rather than one standard deviation for all properties.

Figure 1B:
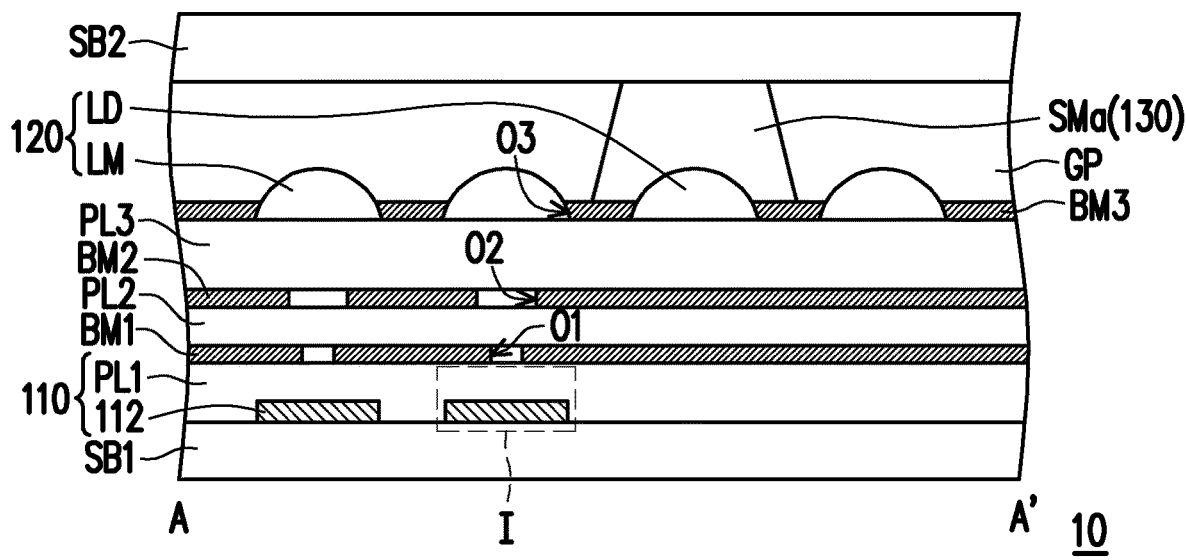
FIG. 1B is a schematic cross-sectional view taken along A section line A-A' of FIG. 1A.
Figure 1C:
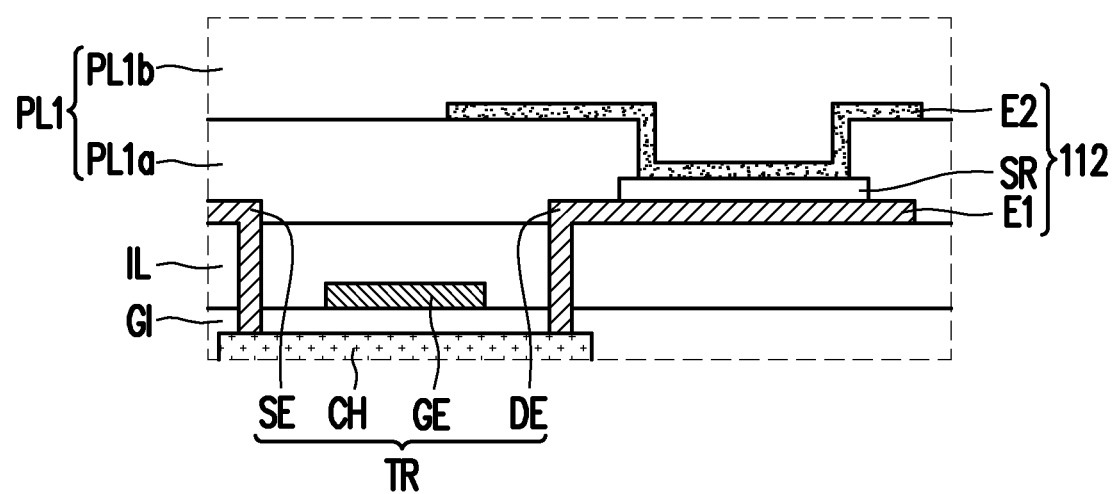
FIG. 1C is an enlarged schematic view of a region I of the fingerprint sensing device 10 of FIG. 1B.

FIG. 1A is a schematic partial top view of a fingerprint sensing device 10 according to an embodiment of the disclosure. FIG. 1B is a schematic cross-sectional view taken along A section line A-A' of FIG. 1A. FIG. 1C is an enlarged schematic view of a region I of the fingerprint sensing device 10 of FIG. 1B. In order to make the presentation of the drawings more concise, FIG. 1A omits some components shown in FIG. 1B and FIG. 1C.

First, referring to FIG. 1A to FIG. 1B at the same time, the fingerprint sensing device 10 includes: a first substrate SB1; a sensing element layer 110 located on the first substrate SB1 and including multiple sensing elements 112; a second substrate SB2 located on the sensing element layer 110; a micro-structure layer 120 located between the second substrate SB2 and the sensing element layer 110, and including multiple micro-lens structures LM and multiple dummy structures LD, in which orthogonal projections of the micro-lens structure LM on the first substrate SB1 respectively overlap orthogonal projections of the sensing elements 112 on the first substrate SB1; and a spacer layer 130 located between the second substrate SB2 and the sensing element layer 110, and including multiple main spacers SMa, in which each of the main spacers SMa covers at least one of the dummy structures LD.

In the fingerprint sensing device 10 according to an embodiment of the disclosure, by disposing the main spacers SMa on the dummy structures LD in the spacer layer 130, the spacer layer 130 is able to maintain a stable spacing while avoiding the micro-lens structure LM crushing, and further improving the regulation of the optical focus point and light acceptance angle to improve the sensing resolution of the fingerprint sensing device 10.

Hereinafter, with FIG. 1A to FIG. 1C, the implementation of each element of the fingerprint sensing device 10 is further described, but the disclosure is not limited thereto.

In this embodiment, the first substrate SB1 of the fingerprint sensing device 10 may be a transparent substrate or an opaque substrate, and its material may be a ceramic substrate, a quartz substrate, a glass substrate, a polymer substrate, or other suitable materials, but not limited thereto. The second substrate SB2 of the fingerprint sensing device 10 may be a transparent substrate, and its material may be a quartz substrate, a glass substrate, a polymer substrate, or other suitable materials, but not limited thereto.

In this embodiment, the sensing element layer 110 may include multiple sensing elements 112 and a planar layer PL1. For example, referring to FIG. 1C, the sensing element layer 110 may include the sensing element 112 and the planar layer PL1, and the planar layer PL1 may include a planar layer PL1a and a planar layer PL1b. The sensing element 112 may be a visible light fingerprint sensing element or an invisible light fingerprint sensing element such as an infrared fingerprint sensing element. For example, the sensing element 112 may include an electrode E1, a sensing layer SR, and an electrode E2. The sensing layer SR may be disposed between the electrode E1 and the electrode E2, and the electrode E2 may be disposed between the planar layer PL1a and the planar layer PL1b.

Specifically, a material of the electrode E1 may be molybdenum, aluminum, titanium, copper, gold, silver, or other conductive materials, or an alloy combination or stack of two or more of the above materials. A material of the sensing layer SR may be silicon-rich oxide (SRO), silicon-rich oxide doped with germanium, or other suitable materials. A material of the electrode E2 is preferably a transparent conductive material, such as indium tin oxide, indium zinc oxide, aluminum tin oxide, aluminum zinc oxide, indium gallium zinc oxide, or a stack of at least two of the above. Materials of the planar layers PL1a and the PL1b may include organic materials, such as acrylic materials, siloxane materials, polyimide materials, epoxy materials, or a stack of the above materials, but not limited thereto.

Referring to FIG. 1C, in some embodiments, the sensing element layer 110 may further include multiple switch elements TR, a gate insulating layer GI, and an interlayer insulating layer IL. The multiple switch elements TR may be electrically connected to multiple sensing elements 112 respectively to individually control the operation of the sensing elements 112. For example, the switch element TR may be composed of a semiconductor layer CH, a gate GE, a source SE, and a drain DE. A region where the semiconductor layer CH overlaps the gate GE can be considered as a channel region of the switch element TR. The gate insulating layer GI is disposed between the gate GE and the semiconductor layer CH, and the interlayer insulating layer IL is disposed between the source SE and the gate GE and between the drain DE and the gate GE. The gate GE and the source SE may respectively receive signals from, for example, driving elements, and the electrode E1 of the sensing element 112 may be physically or electrically connected to the drain DE. When the gate GE receives the signal and turns on the switch element TR, the signal received by the source SE may be transmitted to the electrode E1 of the sensing element 112 through the drain DE.

For example, a material of the semiconductor layer CH may include silicon semiconductor material (e.g., polysilicon, amorphous silicon, etc.), oxide semiconductor material, or organic semiconductor material. Materials of the gate GE, the source SE, and the drain DE may include metals with good electrical conductivity (e.g., aluminum, molybdenum, titanium, copper), alloys, or a stack of the metals and/or alloy, but not limited thereto. Materials of the gate insulating layer GI and the interlayer insulating layer IL may include transparent insulating materials, such as silicon oxide, silicon nitride, silicon oxynitride, a stack of the materials or other suitable materials.

In this embodiment, the micro-structure layer 120 of the fingerprint sensing device 10 may be disposed on the first substrate SB1, and the micro-lens structures LM and the dummy structures LD of the micro-structure layer 120 may be arranged in an array on the sensing element layer 110. In addition, the fingerprint sensing device 10 may further include a light shielding layer BM3, and the micro-lens structures LM and the dummy structures LD of the micro-structure layer 120 may be disposed in openings O3 of the light shielding layer BM3.

Orthogonal projections of the micro-lens structures LM on the first substrate SB1 may respectively overlap orthogonal projections of the sensing elements 112 on the first substrate SB1. Preferably, a central axis of the micro-lens structure LM may pass through the sensing layer SR. More preferably, the central axis of the micro-lens structure LM may overlap a central axis of the sensing layer SR. The micro-lens structure LM may be a lens structure with a greater central thickness than an edge thickness, such as a symmetrical biconvex lens, asymmetrical biconvex lens, plano-convex lens, or concave-convex lens. The micro-lens structure LM may improve light collimation, avoid light leakage, or light mixing caused by scattered or refracted light, and further reduce light loss.

Generally speaking, the sensing element 112 is not disposed below the dummy structure LD; therefore, an orthogonal projection of the dummy structure LD on the first substrate SB1 may be outside the orthogonal projection of the sensing element 112 on the first substrate SB1. That is, the sensing element 112 is disposed in a region other than an orthogonal projection region of the dummy structure LD. The dummy structure LD and the micro-lens structure LM may have the same or different materials and shapes. For example, in this embodiment, the dummy structure LD may have the same material and the same shape as the micro-lens structure LM. However, in some embodiments, the dummy structure LD may have the same material as the micro-lens structure LM and have a different shape than the micro-lens structure LM. In some embodiments, the dummy structure LD may have a different material than the micro-lens structure LM and have the same shape as the micro-lens structure LM. In some embodiments, the dummy structure LD may have a different material and a different shape than the micro-lens structure LM.

In this embodiment, the fingerprint sensing device 10 may also include light shielding layers BM1 and BM2 and planar layers PL2 and PL3 located between the sensing element layer 110 and the micro-structure layer 120. The light shielding layer BM1 is located between the sensing element layer 110 and the planar layer PL2, the light shielding layer BM2 is located between the planar layer and the planar layer PL3, and the micro-lens structure LM and the dummy structure LD are located between the planar layer PL3 and the spacer layer 130.

The light shielding layer BM1 may have multiple openings O1, and orthogonal projections of the openings O1 on the first substrate SB1 may respectively overlap the orthogonal projections of the sensing elements 112 on the first substrate SB1. Similarly, the light shielding layer BM2 may have multiple openings O2, and orthogonal projections of the openings O2 on the first substrate SB1 may respectively overlap the orthogonal projections of the sensing elements 112 on the first substrate SB1. In some embodiments, the orthogonal projections of the openings O1 on first substrate SB1 may overlap the orthogonal projections of openings O2 on first substrate SB1 and the orthogonal projections of the micro-lens structures LM on the first substrate SB1. In some embodiments, central axes of the openings O1 and O2 and the micro-lens structure LM may overlap. In this way, the openings O1 and O2 and the micro-lens structure LM may regulate the light acceptance angle of the sensing element 112 to realize the light collimation design.

Materials of the light shielding layers BM1 and BM2 may include light-shielding materials such as metal, metal oxide, black resin, graphite, or a stack of the light-shielding materials. For example, in some embodiments, the light shielding layer BM1 or the light shielding layer BM2 may include a stack of metal layers and translucent metal oxide layers. Materials of the metal layers may include metals with good electrical conductivity, such as aluminum, molybdenum, titanium, copper, silver, and other metals or stacks thereof, and materials of the translucent metal oxide layers may include metal oxides that reduces the reflectivity of the metal layer, such as molybdenum tantalum oxide (MoTaOx) or molybdenum niobium oxide (MoNbOx), but not limited thereto. In addition, materials of the planar layers PL2 and PL3 may include organic materials or other suitable materials, such as acrylic, siloxane, polyimide, epoxy, or a stack of the above materials.

In this embodiment, the main spacers SMa of the spacer layer 130 may be disposed on the first substrate SB1, and the main spacers SMa may respectively cover one dummy structure LD to form a stable gap GP between the micro-structure layer 120 and the second substrate SB2, A material of the main spacer SMa may include, but not limited to, acrylic. In some embodiments, the main spacer SMa may further include a photoinitiator, and the photoinitiator may help to adjust taper and film thickness of the main spacer SMa during exposure to meet the requirement of higher taper and height of the main spacer SMa.

Hereinafter, other embodiments of the disclosure are illustrated using FIG. 2A to FIG. 11D, and the reference numerals and related contents of the embodiments of FIG. 1A to FIG. 1C are used, where the same numerals are used to denote the same or similar elements, and the description of the same technical contents is omitted. For a description of the omitted parts, reference is made to the embodiments in FIG. 1A to FIG. 1C, which are not repeated in the following descriptions.

Figure 2A:
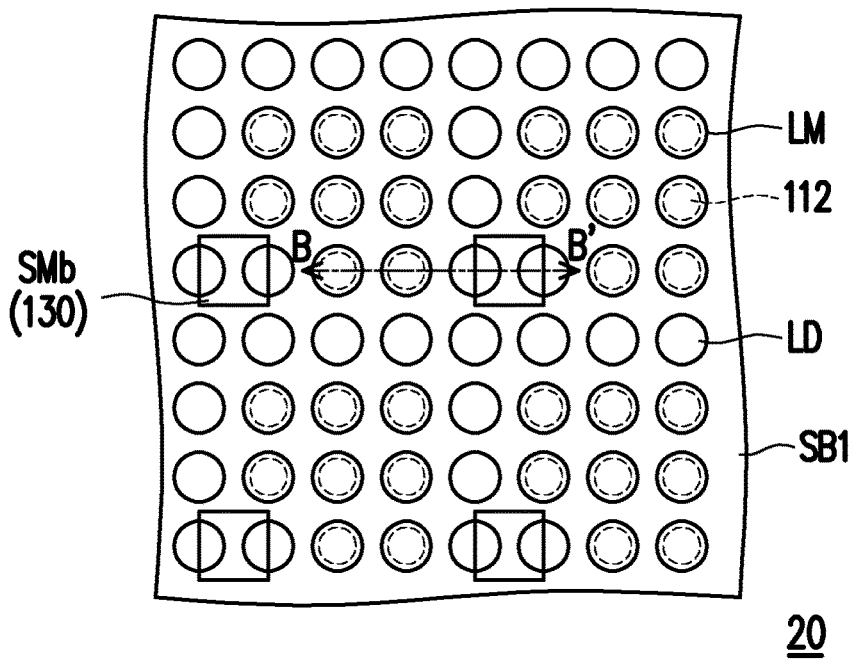
FIG. 2A is a schematic partial top view of a fingerprint sensing device 20 according to an embodiment of the disclosure.
Figure 2B:
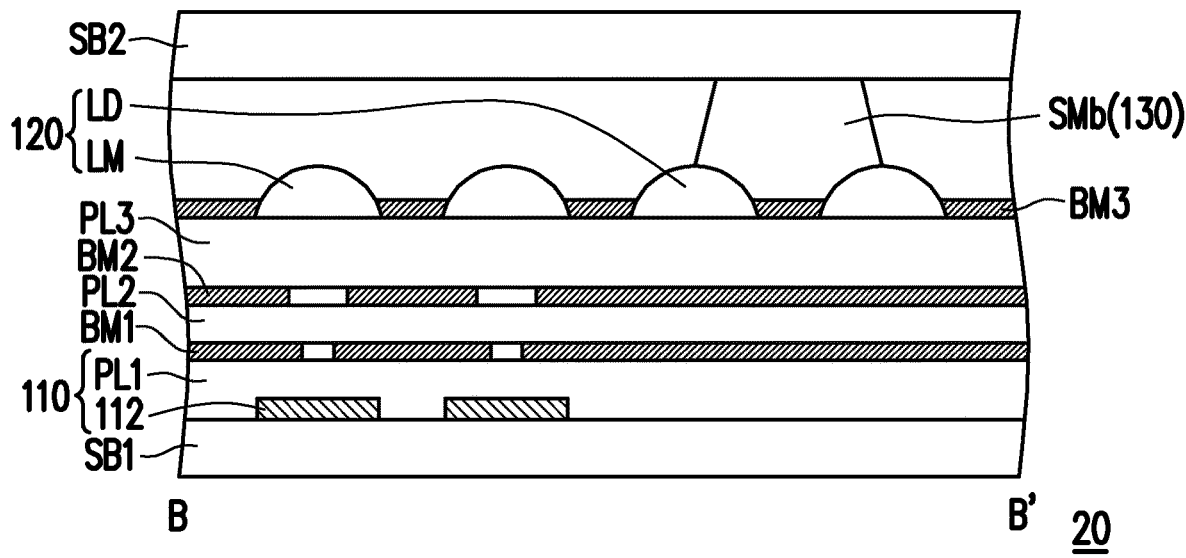
FIG. 2B is a schematic cross-sectional view taken along a section line B-B' of FIG. 2A.

FIG. 2A is a schematic partial top view of a fingerprint sensing device 20 according to an embodiment of the disclosure. FIG. 2B is a schematic cross-sectional view taken along a section line B-B' of FIG. 2A. The fingerprint sensing device 20 includes: a first substrate SB1; a sensing element layer 110 located on the first substrate SB1 and including multiple sensing elements 112 and a planar layer PL1; a second substrate SB2 located on the sensing element layer 110; a micro-structure layer 120 located between the second substrate SB2 and the sensing element layer 110, and including multiple micro-lens structures LM and multiple dummy structures LD; and a spacer layer 130 located between the second substrate SB2 and the micro-structure layer 120, and including multiple main spacers SMb. The fingerprint sensing device 20 further includes light shielding layers BM1, BM2 and BM3 and planar layers PL2 and PL3, which are located between the sensing element layer 110 and the spacer layer 130.

Compared with the fingerprint sensing device 10 shown in FIG. 1A to FIG. 1C, the fingerprint sensing device 20 shown in FIG. 2A to FIG. 2B is different in that: the main spacer SMb of the spacer layer 130 of the fingerprint sensing device 20 may be disposed between two adjacent dummy structures LD and extend over a portion of a surface of the two adjacent dummy structures LD. That is, the main spacer SMb may simultaneously cover a portion of the two adjacent dummy structures LD. The main spacer SMb enables the spacer layer 130 to maintain a stable spacing while avoiding the micro-lens structure LM crushing, and further improving the sensing resolution of the fingerprint sensing device 20.

Figure 3A:
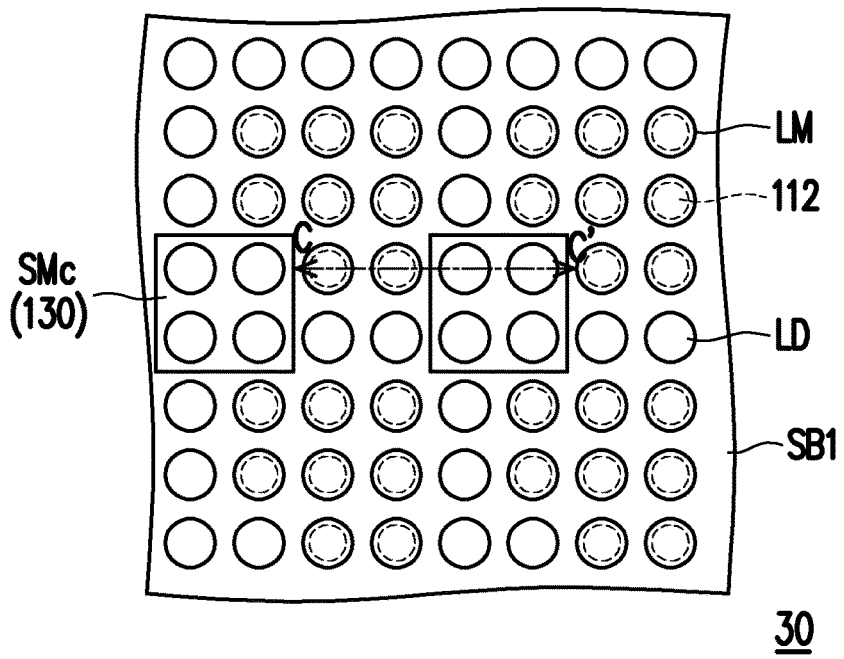
FIG. 3A is a schematic partial top view of a fingerprint sensing device 30 according to an embodiment of the disclosure.
Figure 3B:
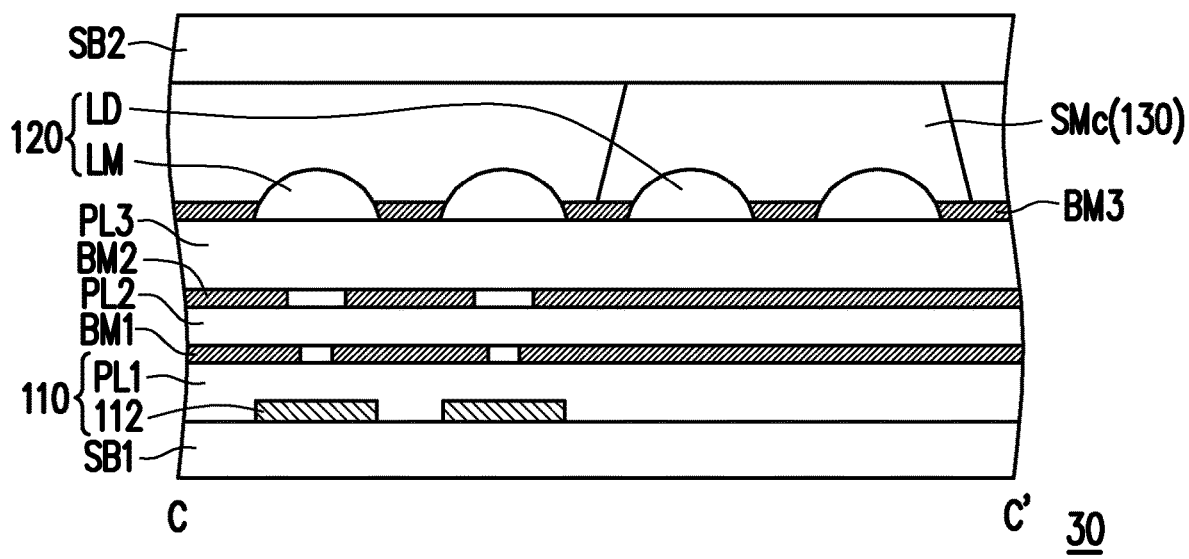
FIG. 3B is a schematic cross-sectional view taken along a section line C-C' of FIG. 3A.

FIG. 3A is a schematic partial top view of a fingerprint sensing device 30 according to an embodiment of the disclosure. FIG. 3B is a schematic cross-sectional view taken along a section line C-C' of FIG. 3A. The fingerprint sensing device 30 includes: a first substrate SB1; a sensing element layer 110 located on the first substrate SB1 and including multiple sensing elements 112 and a planar layer PL1; a second substrate SB2 located on the sensing element layer 110; a micro-structure layer 120 located between the second substrate SB2 and the sensing element layer 110, and including multiple micro-lens structures LM and multiple dummy structures LD; and a spacer layer 130 located between the second substrate SB2 and the micro-structure layer 120, and including multiple main spacers SMc. The fingerprint sensing device 30 further includes light shielding layers BM1, BM2, and BM3 and planar layers PL2 and PL3, which are located between the sensing element layer 110 and the spacer layer 130.

Compared with the fingerprint sensing device 10 shown in FIG. 1A to FIG. 1C, the fingerprint sensing device 30 shown in FIG. 3A to FIG. 3B is different in that: the main spacer SMc of the spacer layer 130 of the fingerprint sensing device 30 may cover four adjacent dummy structures LD. The main spacer SMc enables the spacer layer 130 to maintain a stable spacing while avoiding the micro-lens structure LM crushing, and further improving the sensing resolution of the fingerprint sensing device 30.

Figure 4A:
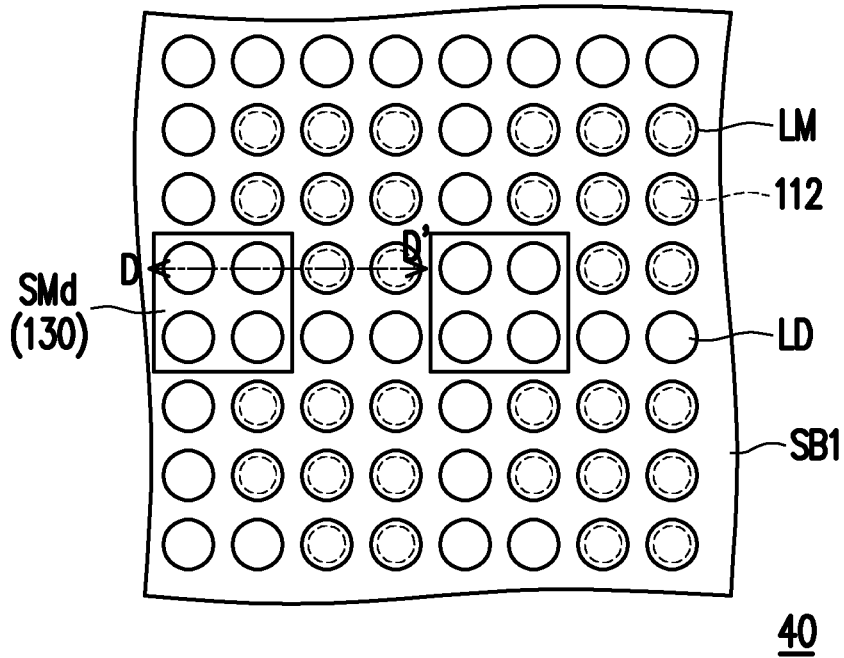
FIG. 4A is a schematic partial top view of a fingerprint sensing device 40 according to an embodiment of the disclosure.
Figure 4B:
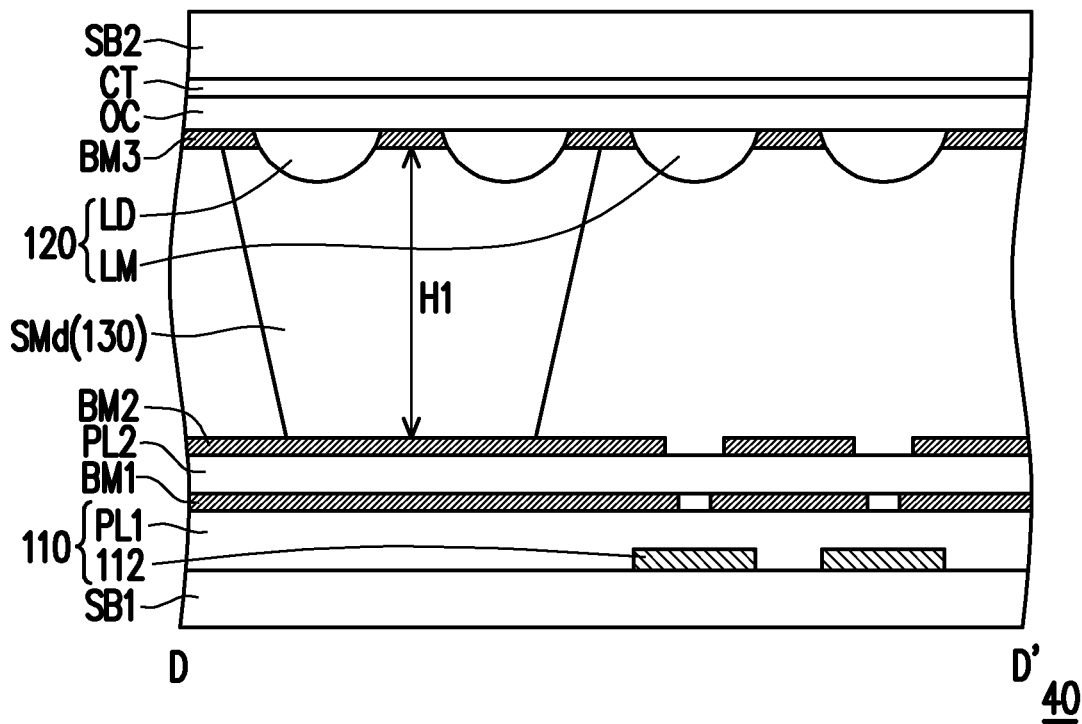
FIG. 4B is a schematic cross-sectional view taken along a section line D-D' of FIG. 4A.

FIG. 4A is a schematic partial top view of a fingerprint sensing device 40 according to an embodiment of the disclosure. FIG. 4B is a schematic cross-sectional view taken along a section line D-D' of FIG. 4A. The fingerprint sensing device 40 includes: a first substrate SB1; a sensing element layer 110 located on the first substrate SB1 and including multiple sensing elements 112 and a planar layer PL1; a second substrate SB2 located on the sensing element layer 110; a micro-structure layer 120 located between the second substrate SB2 and the sensing element layer 110, and including multiple micro-lens structures LM and multiple dummy structures LD; and a spacer layer 130 located between the second substrate SB2 and the sensing element layer 110, and including multiple main spacers SMd, in which each of the main spacers SMd covers four dummy structures LD.

Compared with the fingerprint sensing device 30 shown in FIG. 3A to FIG. 3B, the fingerprint sensing device 40 shown in FIG. 4A to FIG. 4B is different in that: the micro-structure layer 120, the spacer layer 130 and the light shielding layer BM3 may be disposed on the second substrate SB2, the main spacers SMd of the spacer layer 130 may be located between the dummy structures LD of the micro-structure layer 120 and the sensing element layer 110, and light shielding layers BM1 and BM2 and a planar layer PL2 may be located between the sensing element layer 110 and the main spacers SMd.

In this embodiment, the fingerprint sensing device 40 may further include an optical layer OC and a color conversion layer CT, and the optical layer OC and the color conversion layer CT may be disposed on the second substrate SB2. The color conversion layer CT may be located between the optical layer OC and the second substrate SB2, and the optical layer OC may be located between the color conversion layer CT and the micro-structure layer 120. In this way, the second substrate SB2 may also serve as a color filter substrate.

In this embodiment, a height H1 of the main spacer SMd may be greater than 10 µm, such as 12 µm, 15 µm or 20 µm, to enhance a light collimation effect provided by the light shielding layers BM1 and BM2 and the micro-lens structure LM, while the main spacer SMd enables the spacer layer 130 to maintain a stable spacing while avoiding the micro-lens structure LM crushing, and further improving the sensing resolution of the fingerprint sensing device 40.

Figure 5A:
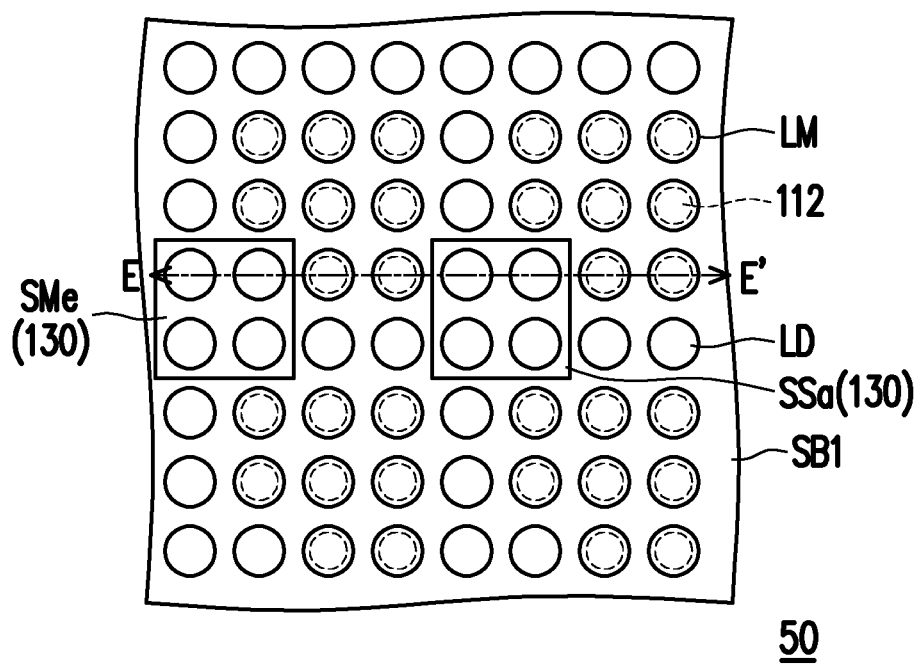
FIG. 5A is a schematic partial top view of a fingerprint sensing device 50 according to an embodiment of the disclosure.
Figure 5B:
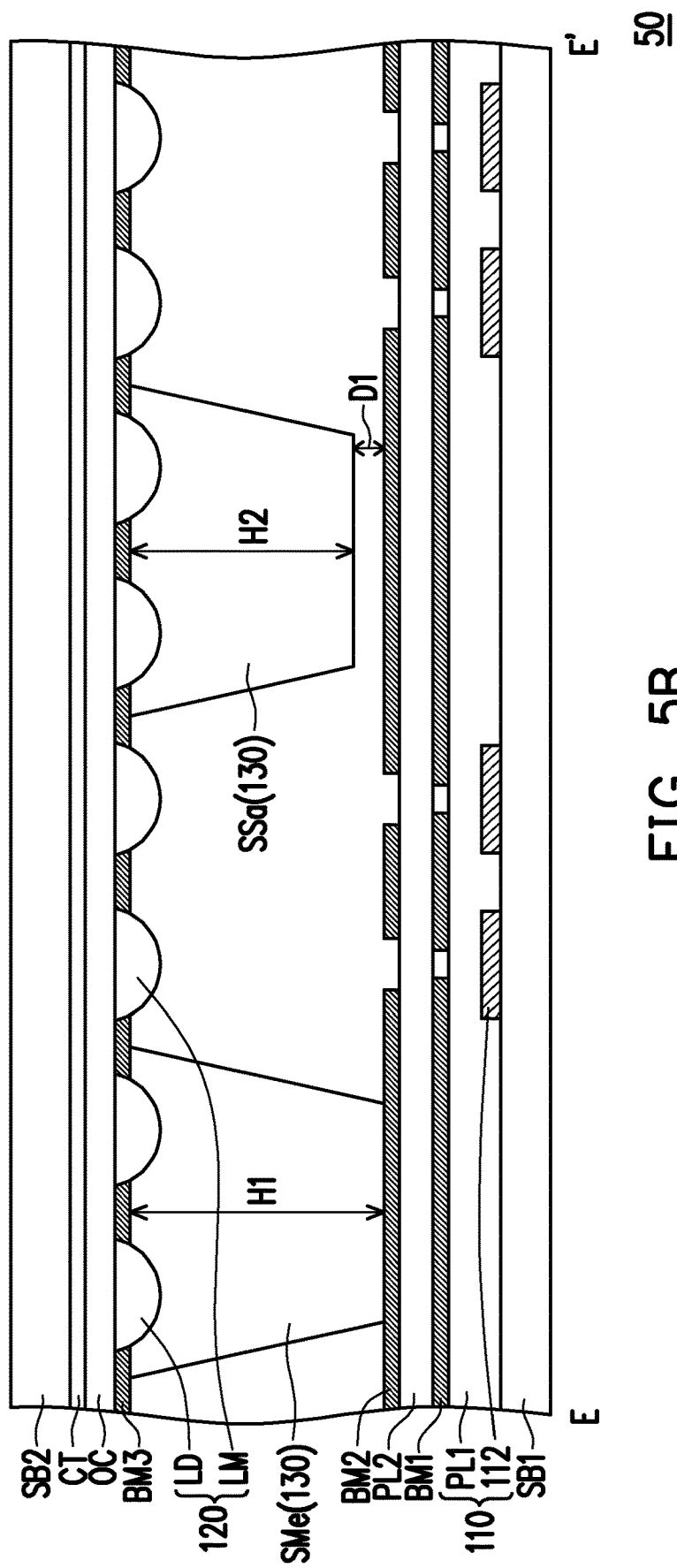
FIG. 5B is a schematic cross-sectional view taken along a section line E-E' of FIG. 5A.

FIG. 5A is a schematic partial top view of a fingerprint sensing device 50 according to an embodiment of the disclosure. FIG. 5B is a schematic cross-sectional view taken along a section line E-E' of FIG. 5A. The fingerprint sensing device 50 includes: a first substrate SB1; a sensing element layer 110 located on the first substrate SB1 and including multiple sensing elements 112 and a planar layer PL1; a second substrate SB2 located on the sensing element layer 110; a micro-structure layer 120 located between the second substrate SB2 and the sensing element layer 110, and including multiple micro-lens structures LM and multiple dummy structures LD; and a spacer layer 130 located between the second substrate SB2 and the sensing element layer 110, and including multiple main spacers SMe, in which each of the main spacers SMe covers four dummy structures ID. The fingerprint sensing device 50 further includes light shielding layers BM1, BM2, and BM3, s planar layer PL2, an optical layer OC, and a color conversion layer CT.

Compared with the fingerprint sensing device 40 shown in FIG. 4A to FIG. 4B, the fingerprint sensing device 50 shown in FIG. 5A to FIG. 5B is different in that: the spacer layer 130 of the fingerprint sensing device 50 further includes multiple sub-spacers SSa, each of the sub-spacers SSa covers at least one of the dummy structures LD, and a height H2 of the sub-spacer SSa is smaller than the height H1 of the main spacer SMe.

In this embodiment, the sub-spacer SSa and the main spacer SMe may cover four dummy structures LD, so that projected areas of the sub-spacers SSa on the second substrate SB2 may be similar to or equal to projected areas of the main spacers SMe on the second substrate SB2, but not limited thereto. In some embodiments, the sub-spacer SSa and the main spacer SMe may cover one, two, three, six or more dummy structures LD respectively, and the projected area of the sub-spacer SSa on the second substrate SB2 may be different from the projected area of the main spacer SMe on the second substrate SB2.

In this embodiment, the height H2 of the sub spacer SSa is smaller than the height H1 of the main spacer SMe, so that there may be a spacing D1 between the sub-spacer SSa and the light shielding layer BM2, and the sum of the height H2 and the spacing D1 may be approximately the same as or equal to the height H1. The sub-spacer SSa may assist the spacer layer 130 in maintaining a stable spacing while providing a suitable pressure buffer space for the fingerprint sensing device 50.

Figure 6A:
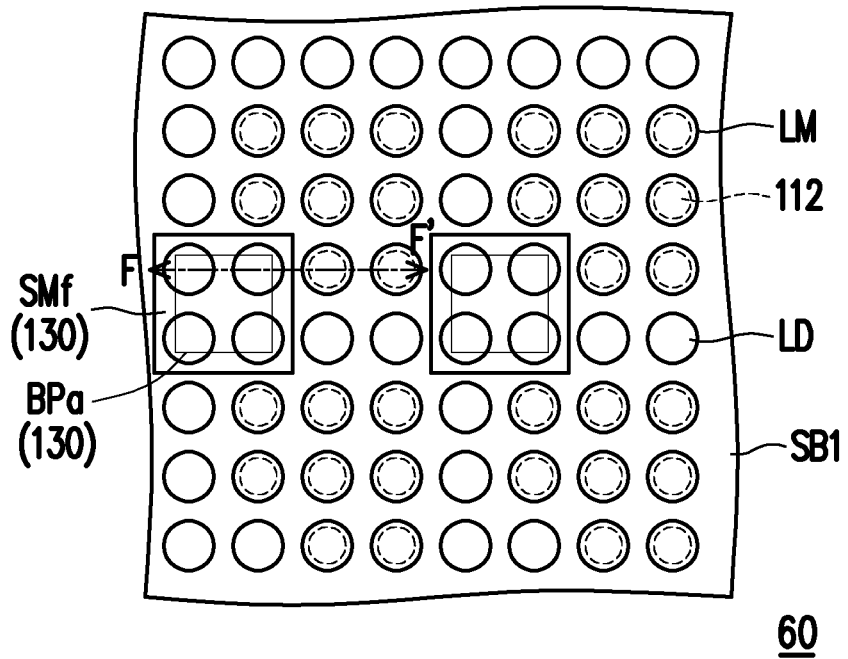
FIG. 6A is a schematic partial top view of a fingerprint sensing device 60 according to an embodiment of the disclosure.
Figure 6B:
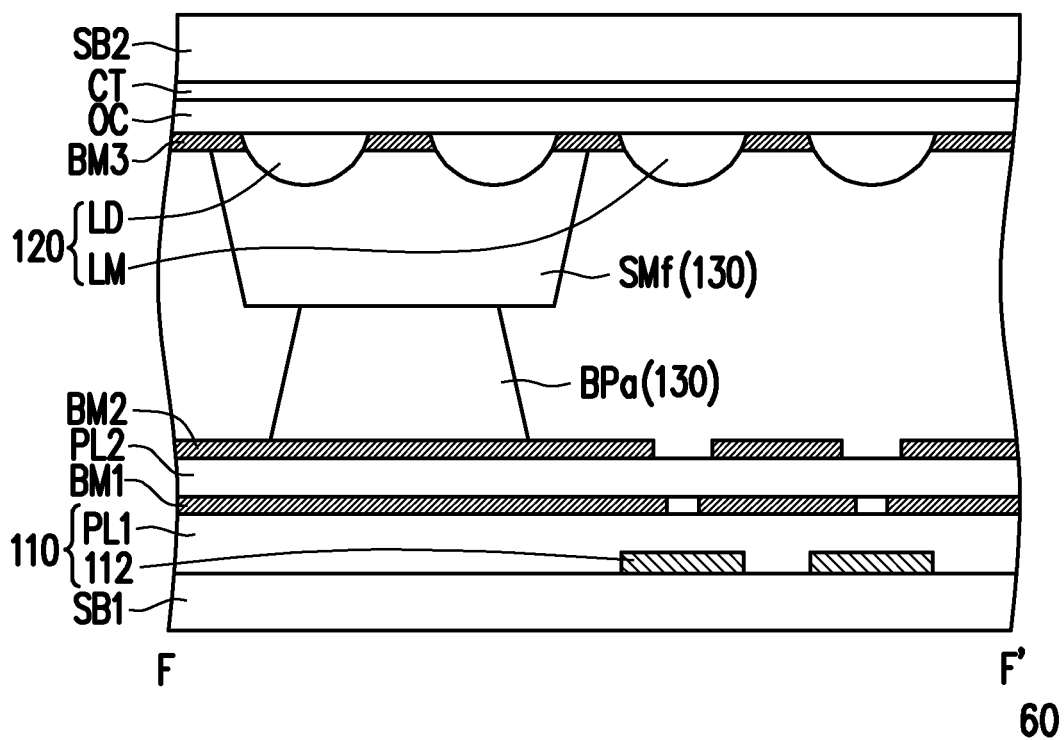
FIG. 6B is a schematic cross-sectional view taken along a section line F-F' of FIG. 6A.

FIG. 6A is a schematic partial top view of a fingerprint sensing device 60 according to an embodiment of the disclosure. FIG. 6B is a schematic cross-sectional view taken along a section line F-F' of FIG. 6A. The fingerprint sensing device 60 includes: a first substrate SB1; a sensing element layer 110 located on the first substrate SB1 and including multiple sensing elements 112 and a planar layer PL1; a second substrate SB2 located on the sensing element layer 110; a micro-structure layer 120 located between the second substrate SB2 and the sensing element layer 110, and including multiple micro-lens structures LM and multiple dummy structures LD; and a spacer layer 130 located between the second substrate SB2 and the sensing element layer 110, and including multiple main spacers SMf, in which each of the main spacers SMf covers four dummy structures LD. The fingerprint sensing device 60 further includes light shielding layers BM1, BM2, and BM3, a planar layer PL2, an optical layer OC, and a color conversion layer CT.

Compared with the fingerprint sensing device 40 shown in FIG. 4A to FIG. 4B, the fingerprint sensing device 60 shown in FIG. 6A to FIG. 6B is different in that: the spacer layer 130 of the fingerprint sensing device 60 further includes multiple bumps BPa, and the main spacers SMf are located between the bumps BPa and the dummy structures LD.

In this embodiment, projected areas of the bumps BPa on the first substrate SB1 may be smaller than projected areas of the main spacers SMf on the first substrate SB1, but not limited thereto. The bumps BPa may be disposed on the first substrate SB1, and orthogonal projections of the bumps BPa on the first substrate SB1 may overlap orthogonal projections of the main spacers SMf on the first substrate SB1, so that the bumps BPa and the main spacers SMf may be against with each other to maintain a stable spacing of the spacer layer 130, and the spacing of the spacer layer 130 is further increased to improve the light collimation effect without being limited by a film thickness of the main spacer SMf.

Figure 7A:
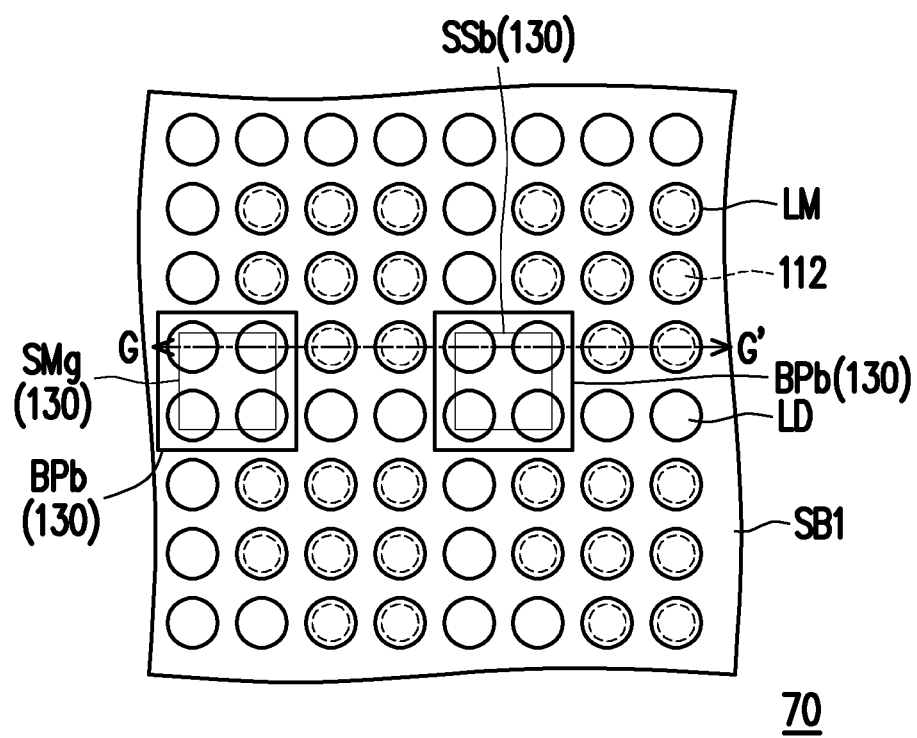
FIG. 7A is a schematic partial top view of a fingerprint sensing device 70 according to an embodiment of the disclosure.
Figure 7B:
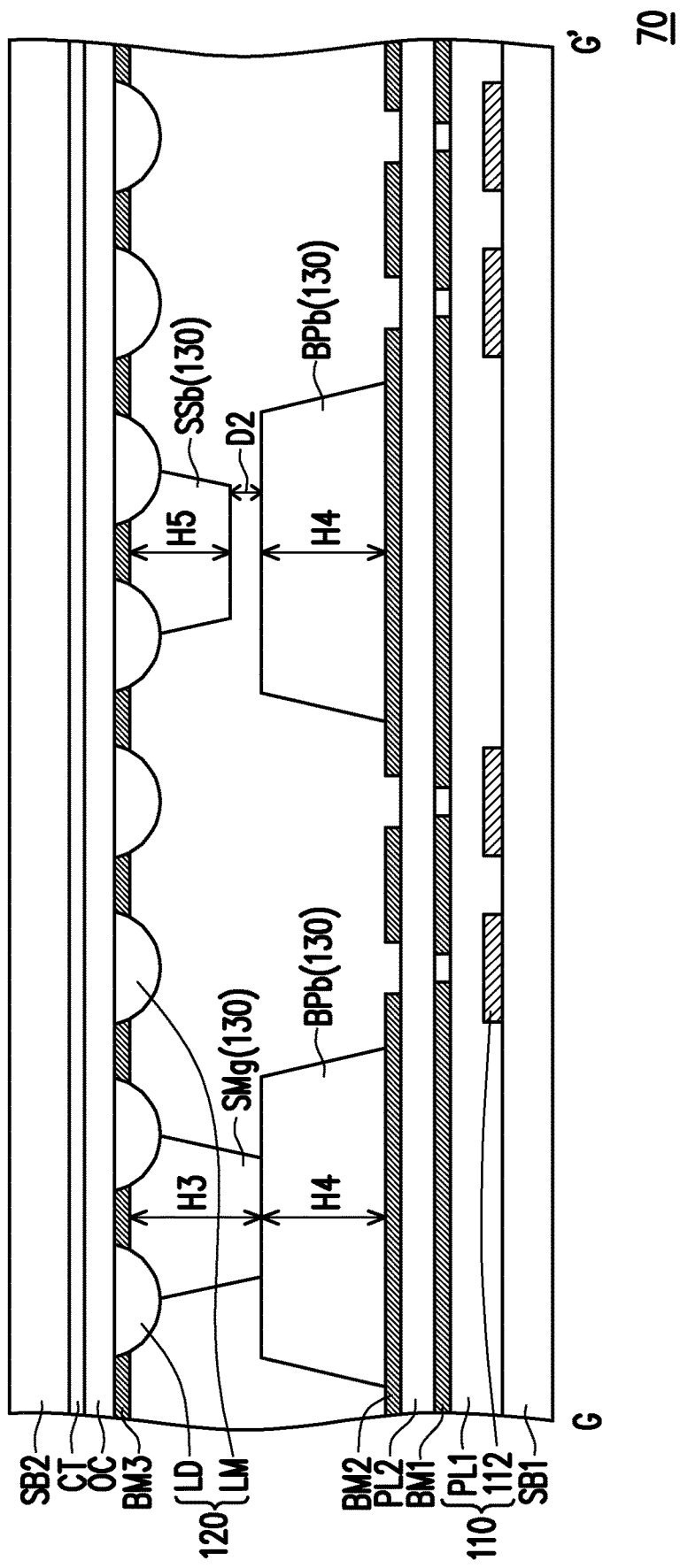
FIG. 7B is a schematic cross-sectional view taken along a section line G-G' of FIG. 7A.

FIG. 7A is a schematic partial top view of a fingerprint sensing device 70 according to an embodiment of the disclosure. FIG. 7B is a schematic cross-sectional view taken along a section line G-G' of FIG. 7A. The fingerprint sensing device 70 includes: a first substrate SB1; a sensing element layer 110 located on the first substrate SB1 and including multiple sensing elements 112 and a planar layer; a second substrate SB2 located on the sensing element layer 110; a micro-structure layer 120 located between the second substrate SB2 and the sensing element layer 110, and including multiple micro-lens structures LM and multiple dummy structures LD; a spacer layer 130 located between the second substrate SB2 and the sensing element layer 110 and including multiple main spacers SMg and sub-spacers SSb. The fingerprint sensing device 70 further includes light shielding layers BM1, BM2, and BM3, a planar layer PL2, an optical layer OC, and a color conversion layer CT.

Compared with the fingerprint sensing device 50 shown in FIG. 5A to FIG. 5B, the fingerprint sensing device 70 shown in FIG. 7A to FIG. 7B is different in that: the spacer layer 130 of the fingerprint sensing device 70 further includes multiple bumps BPb, and the main spacers SMg and the sub-spacers SSb are located between the bumps BPb and the dummy structures LD, respectively. In addition, projected areas of the bumps BPb on the first substrate SB1 may be larger than projected areas of the main spacers SMg or the sub-spacers SSb on the first substrate SB1.

In this embodiment, the main spacer SMg and the sub-spacer SSb may respectively cover a portion of each of two adjacent dummy structures LD, and a height H3 of the main spacer SMg is greater than a height H5 of the sub-spacer SSb, so that there may be a spacing D2 between the sub-spacer SSb and the bump BPb, and the sum of the height H5 and the spacing D2 may be approximately the same as or equal to the height H3. In addition, the bump BPb may have a height H4, so that the spacer layer 130 may have a spacing H3+H4. In this way, the bump BPb and the main spacer SMg may be against with each other to maintain a stable spacing of the spacer layer 130, and may provide a larger spacing of the spacer layer 130, while the sub-spacers SSb and the bumps BPb may also provide a suitable pressure buffer space for the fingerprint sensing device 70.

Figure 8A:
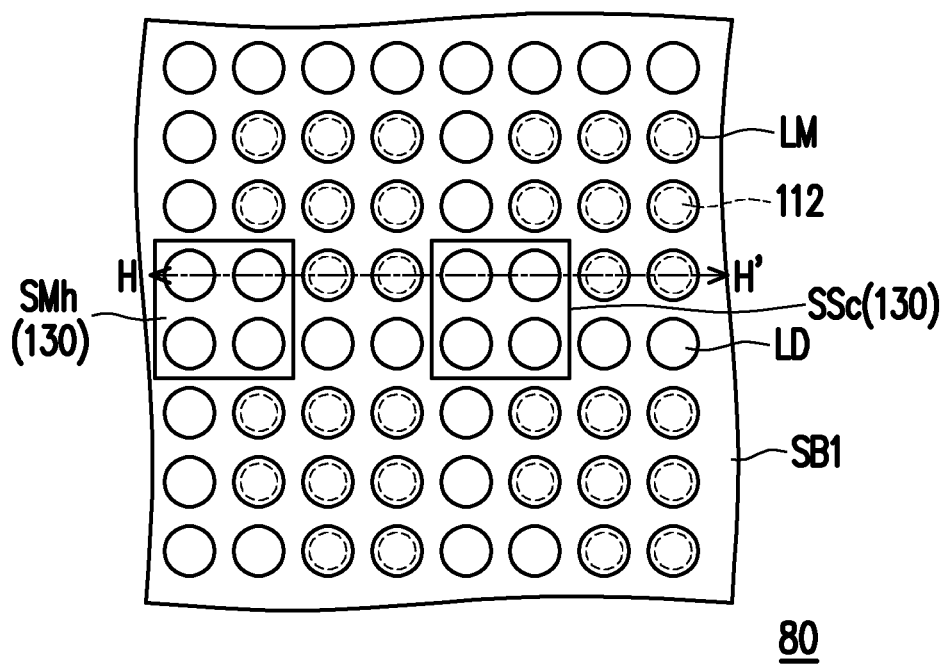
FIG. 8A is a schematic partial top view of a fingerprint sensing device 80 according to an embodiment of the disclosure.
Figure 8B:
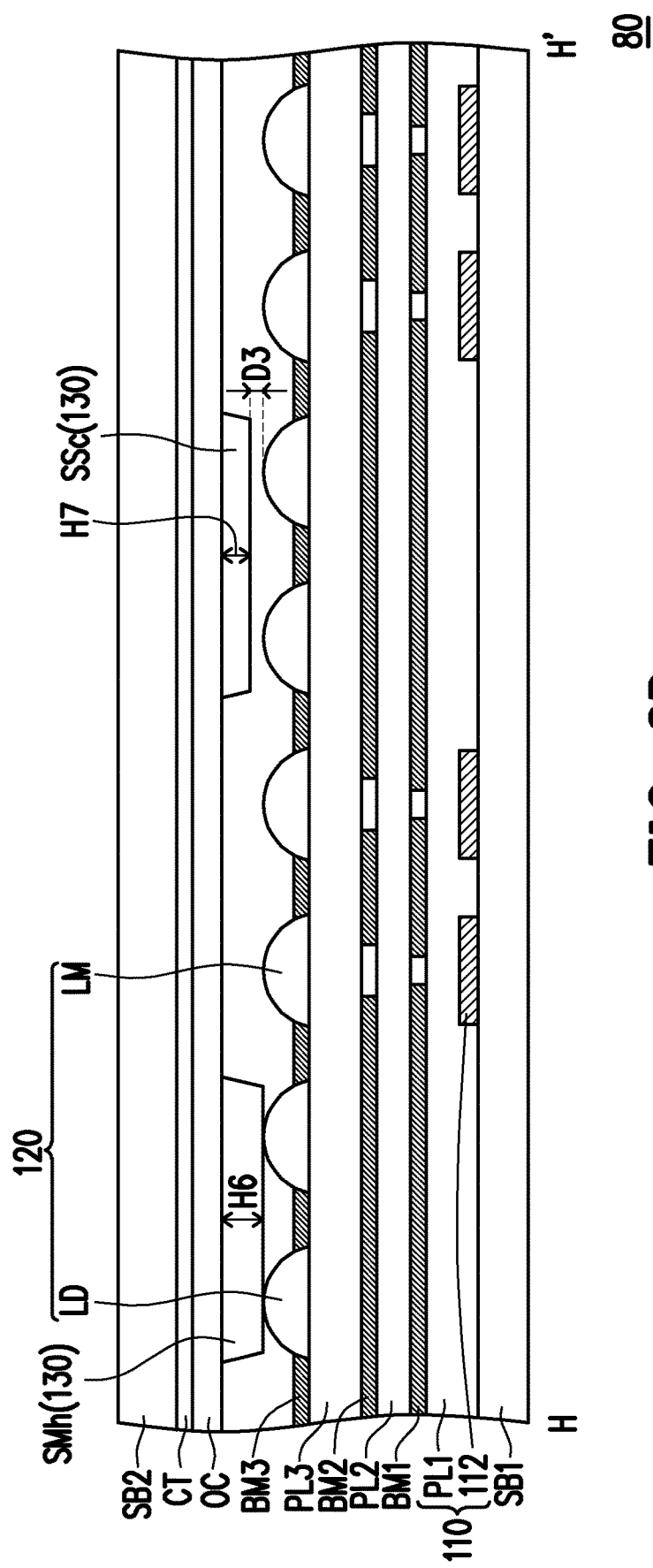
FIG. 8B is a schematic cross-sectional view taken along a section line H-H' of FIG. 8A.

FIG. 8A is a schematic partial top view of a fingerprint sensing device 80 according to an embodiment of the disclosure. FIG. 8B is a schematic cross-sectional view taken along a section line H-H' of FIG. 8A. The fingerprint sensing device 80 includes: a first substrate SB1; a sensing element layer 110 located on the first substrate SB1 and including multiple sensing elements 112 and a planar layer PL1; a second substrate SB2 located on the sensing element layer 110; a micro-structure layer 120 located between the second substrate SB2 and the sensing element layer 110, and including multiple micro-lens structures LM and multiple dummy structures LD; and a spacer layer 130 located on one side (e.g., an upper side) of the micro-structure layer 120, and including multiple main spacers SMh and multiple sub-spacers SSc, in which each of the main spacers SMh and each of the sub-spacers SSc respectively overlap at least one (e.g., four) of the dummy structures LD, and a height H7 of the sub-spacer SSc is smaller than a height H6 of the main spacer SMh.

Compared with the fingerprint sensing device 30 shown in FIG. 3A to FIG. 3B, the fingerprint sensing device 80 shown in FIG. 8A to FIG. 8B is different in that: the spacer layer 130 of the fingerprint sensing device 80 further includes the sub-spacers SSc, and the main spacers SMh and the sub-spacers SSc of the spacer layer 130 are disposed on the second substrate SB2 without covering the dummy structures LD. In addition to light shielding layers BM1, BM2, and BM3 and the planar layers PL2 and PL3, the fingerprint sensing device 80 also includes an optical layer OC and a color conversion layer CT located between the spacer layer 130 and the second substrate SB2, so that the second substrate SB2 may also serve as a color filter substrate.

In this embodiment, the height H7 of the sub-spacer SSc is smaller than the height H6 of the main spacer SMh, so that there may be a spacing D3 between the sub-spacer SSc and the dummy structure LD, and the sum of the height H7 and the spacing D3 may be approximately the same as or equal to the height H6. The main spacer SMh may be disposed against the dummy structure LD to maintain a stable spacing of the spacer layer 130, and the sub-spacer SSc may assist in maintaining a stable spacing while providing a suitable pressure buffer space for the fingerprint sensing device 80.

Figure 9A:
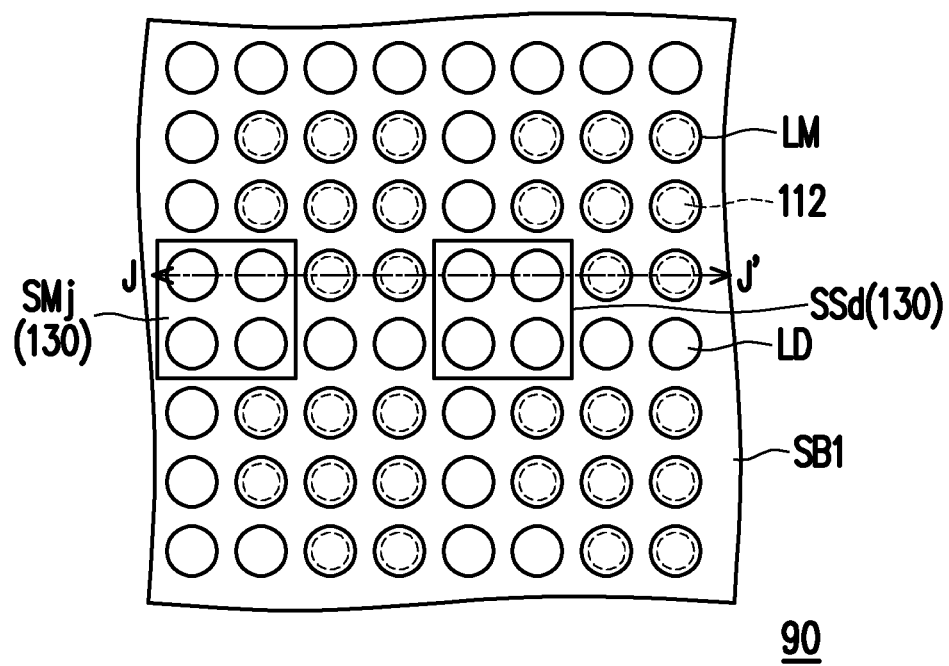
FIG. 9A is a schematic partial top view of a fingerprint sensing device 90 according to an embodiment of the disclosure.
Figure 9B:
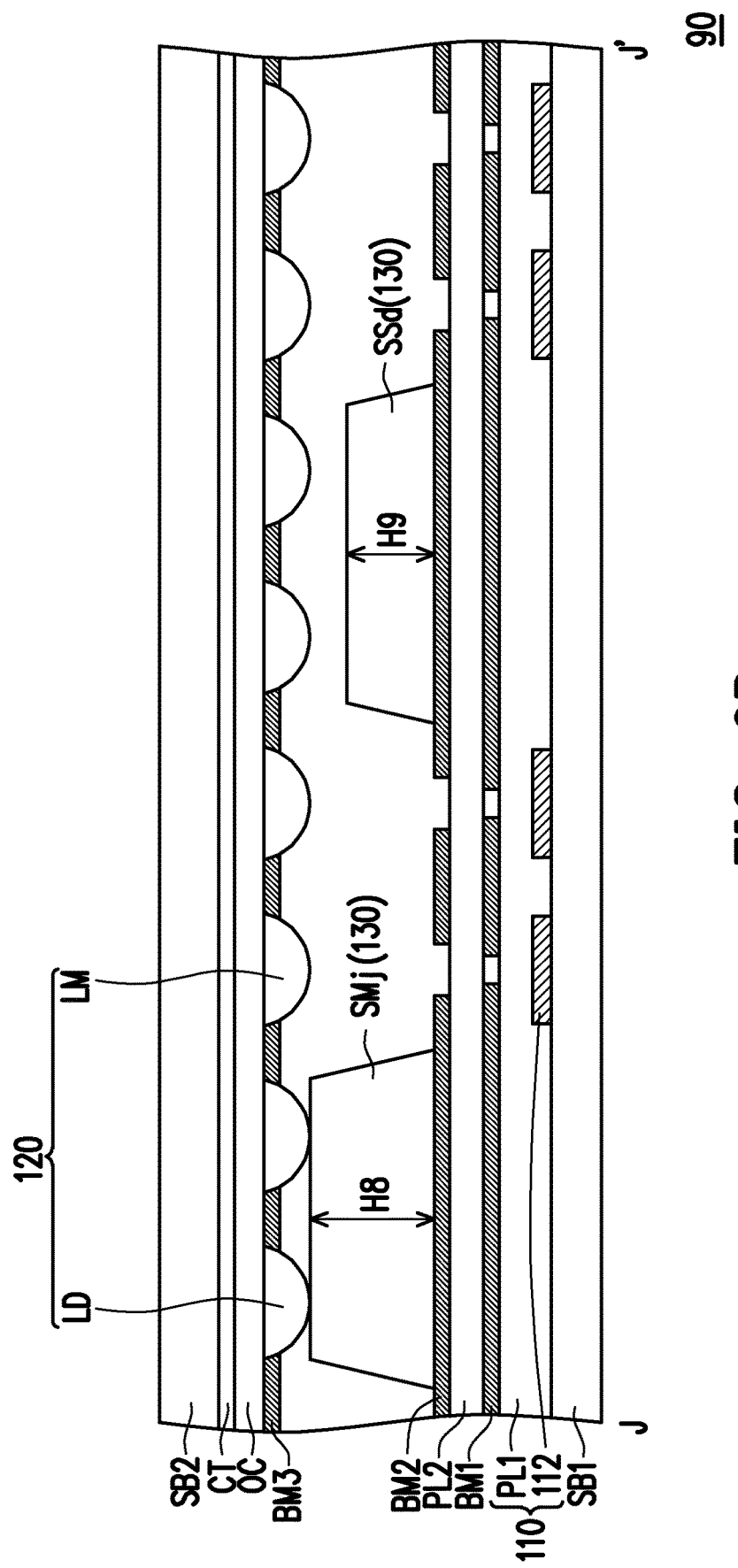
FIG. 9B is a schematic cross-sectional view taken along a section line J-J' of FIG. 9A.

FIG. 9A is a schematic partial top view of a fingerprint sensing device 90 according to an embodiment of the disclosure. FIG. 9B is a schematic cross-sectional view taken along a section line J-J' of FIG. 9A. The fingerprint sensing device 90 includes: a first substrate SB1; a sensing element layer 110 located on the first substrate SB1 and including multiple sensing elements 112 and a planar layer PL1; a second substrate SB2 located on the sensing element layer 110; a micro-structure layer 120 located between the second substrate SB2 and the sensing element layer 110, and including multiple micro-lens structures LM and multiple dummy structures LD; and a spacer layer 130 located on one side (e.g., a lower side) of the micro-structure layer 120, and including multiple main spacers SMj and multiple sub-spacers SSd, in which each of the main spacers SMj and each of the sub-spacers SSd respectively overlap at least one (e.g., four) of the dummy structures LD, and a height H9 of the sub-spacer SSd is smaller than a height H8 of the main spacer SMj. In addition, the fingerprint sensing device 90 may further include light shielding layers BM1, BM2, and BM3, a planar layer PL2, an optical layer OC, and a color conversion layer CT.

Compared with the fingerprint sensing device 50 shown in FIG. 5A to FIG. 5B, the fingerprint sensing device 90 shown in FIG. 9A to FIG. 9B is different in that: the main spacers SMj and the sub-spacers SSd of the spacer layer 130 of the fingerprint sensing device 90 are disposed on the first substrate SB1 without covering the dummy structures LD, the main spacer SMj may be disposed against the dummy structure LD to maintain a stable spacing of the spacer layer 130, and the sub-spacer SSd may assist in maintaining a stable spacing while providing a suitable pressure buffer space for the fingerprint sensing device 90.

Figure 10A:
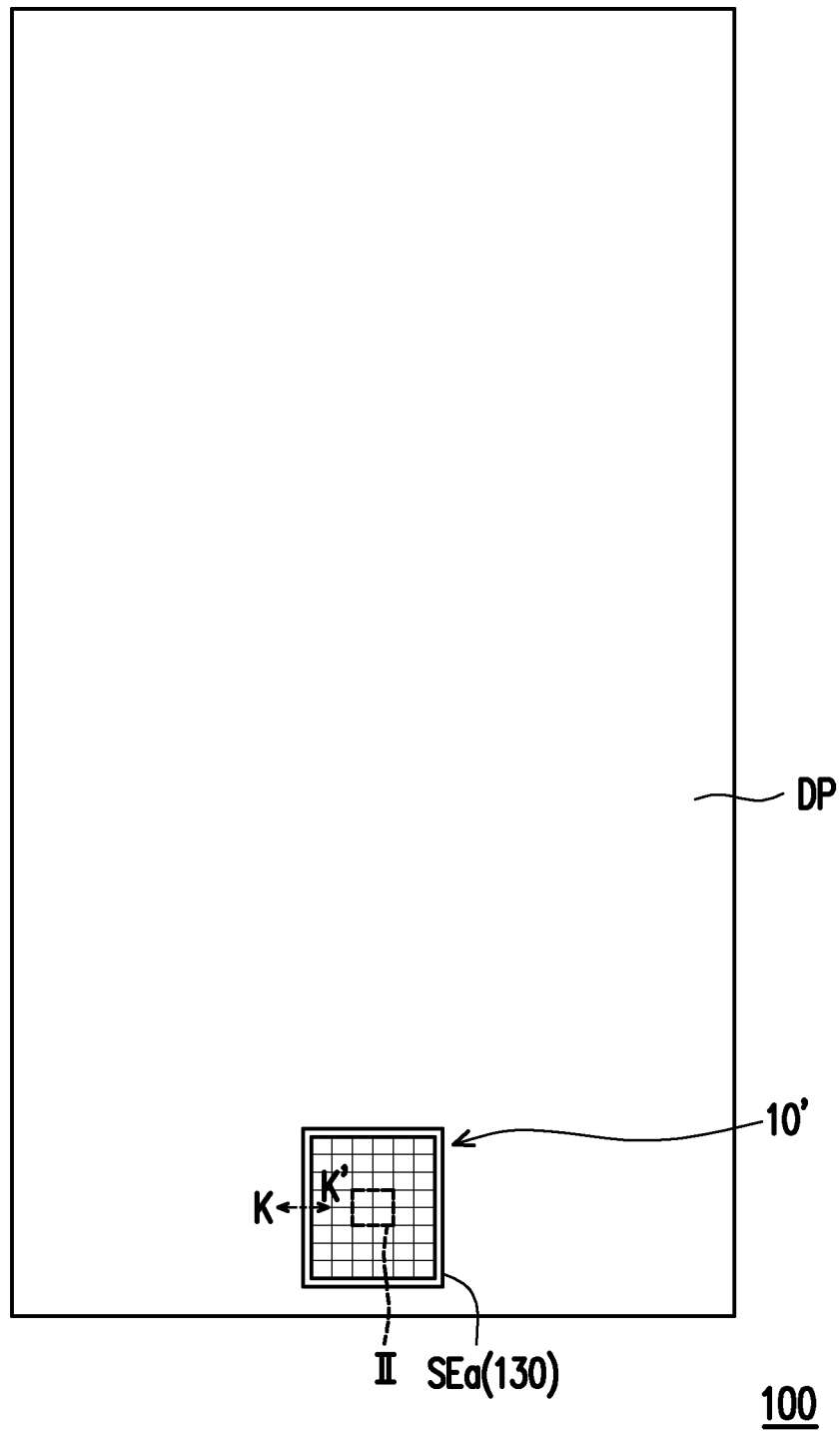
FIG. 10A is a schematic top view of a display device 100 of a fingerprint sensing device 10' according to an embodiment of the disclosure.
Figure 10B:
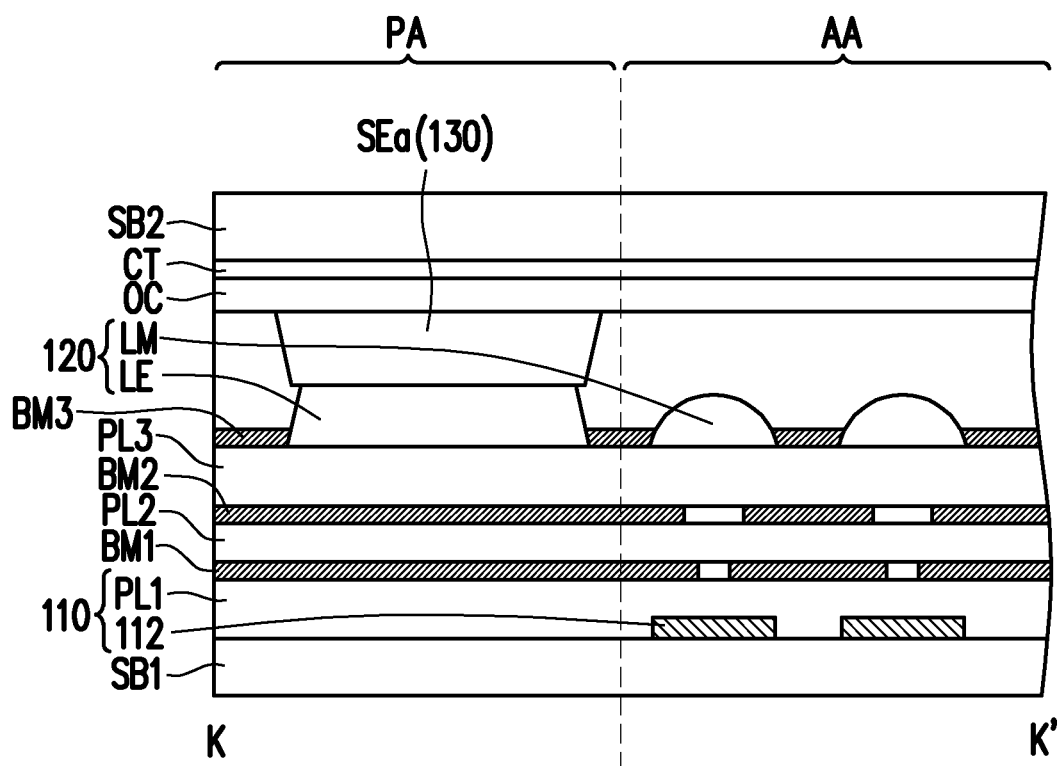
FIG. 10B is a schematic cross-sectional view taken along a section line K-K' of FIG. 10A.

FIG. 10A is a schematic top view of a display device 100 of a fingerprint sensing device 10' according to an embodiment of the disclosure. FIG. 10B is a schematic cross-sectional view taken along a section line K-K' of FIG. 10A. The display device 100 may include a display panel DP and a fingerprint sensing device 10', and the display device 100 may be, for example, a cell phone with a fingerprint unlock function.

Referring to FIG. 10A and FIG. 10B at the same time, in this embodiment, the fingerprint sensing device 10' may have a sensing region AA and a peripheral region PA, a region II in FIG. 10A is located in the sensing region AA, and an enlarged schematic view of the region II may be shown in FIG. 8A. That is to say, the sensing region AA of the fingerprint sensing device 10' may have a structure shown in FIG. 8B, and the fingerprint sensing device 10' may include the first substrate SB1, the sensing element layer 110, the light shielding layer BM1, the planar layer the light shielding layer BM2, the planar layer PL3, the light shielding layer BM3, the micro-structure layer 120, the spacer layer 130, the optical layer OC, the color conversion layer CT, and the second substrate SB2.

In addition, a schematic cross-sectional view of the peripheral region PA of the fingerprint sensing device 10' may be shown in FIG. 10B. In this embodiment, the spacer layer 130 of the fingerprint sensing device 10' may further include a peripheral spacer SEa located in the peripheral region PA, and the micro-structure layer 120 may also include a dummy structure LE located in the peripheral region PA. Shapes of the dummy structure LE and the micro-lens structure LM may be different, and the peripheral spacer SEa and the dummy structure LE may be against with each other to maintain a stable spacing between the optical layer OC or the second substrate SB2 and the micro-lens structure LM.

Figure 11A:
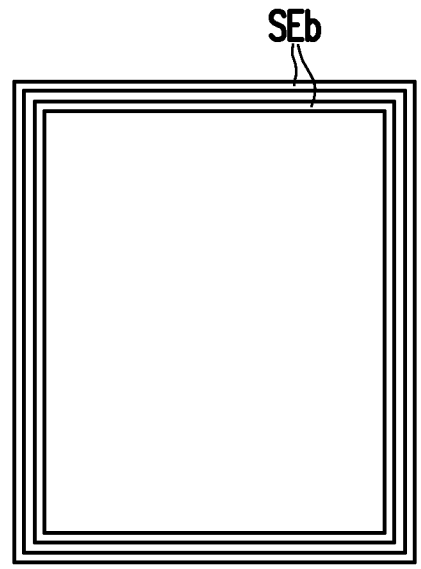
FIG. 11A to FIG. 11D are schematic top views of peripheral spacers SEb, SEc, SEd, and SEe of a fingerprint sensing device according to an embodiment of the disclosure, respectively.
Figure 11B:
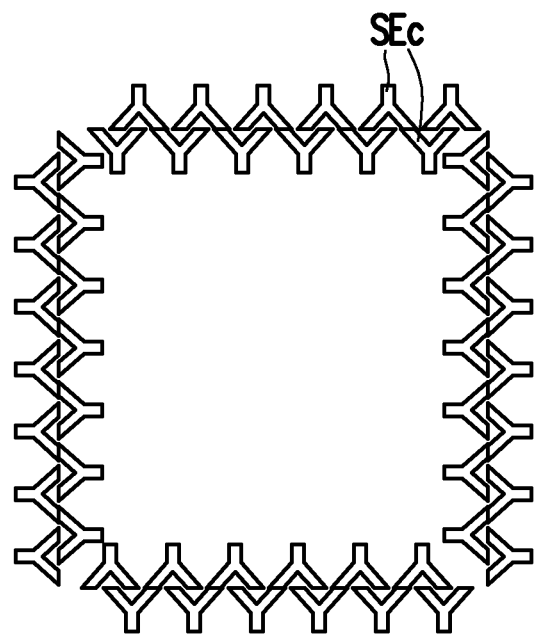
Figure 11C:
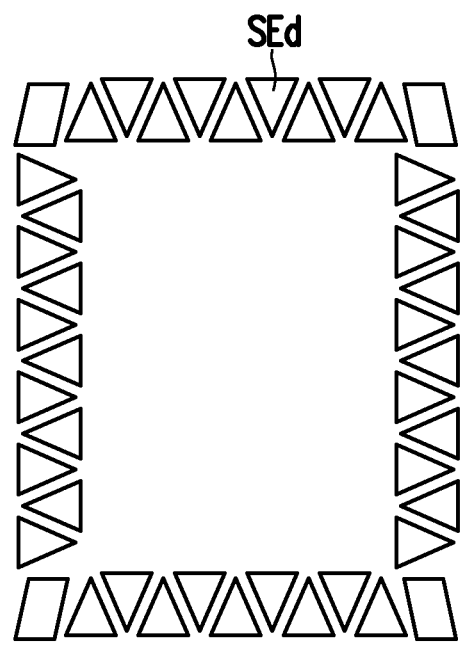
Figure 11D:
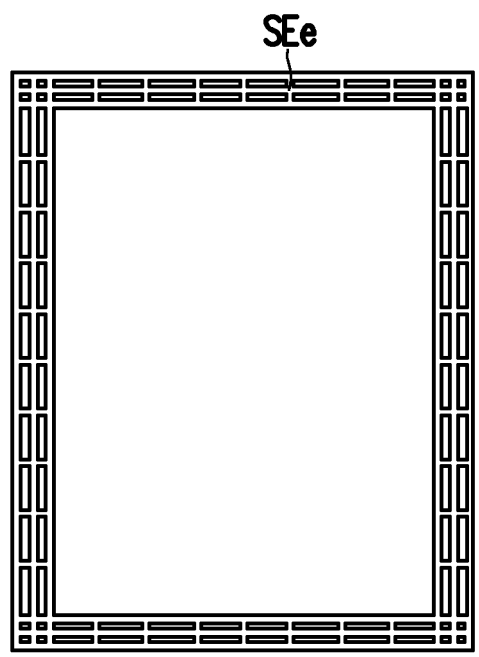

In some embodiments, the fingerprint sensing device 10' may be any one of the fingerprint sensing device 10 to the fingerprint sensing device 90. For example, FIG. 1A, FIG. 2A, FIG. 3A, FIG. 4A, FIG. 5A, FIG. 6A, FIG. 7A and FIG. 9A may be enlarged schematic views of the region II in FIG. 10A, and the peripheral region PA of the fingerprint sensing device 10' may have the structure shown in FIG. 1B, FIG. 2B, FIG. 3B, FIG. 4B, FIG. 5B, FIG. 6B, 7B or FIG. 9B. In this embodiment, as shown in FIG. 10A, the peripheral spacer SEa may present a top-view outline of a single-layer rectangle, but is not limited thereto. FIG. 11A to FIG. 11D are schematic top views of peripheral spacers SEb, SEc, SEd, and SEe of a fingerprint sensing device according to an embodiment of the disclosure, respectively. In some embodiments, as shown in FIG. 11A, the peripheral spacer SEb may present the top-view outline of multi-layer rectangle. In some embodiments, as shown in FIG. 11B, the perimeter spacer SEc may present a top-view outline with multiple interlacing layers. In some embodiments, as shown in FIG. 11C, the peripheral spacer SEd may present a top-view outline of a multi-graphic combination. In some embodiments, as shown in FIG. 11D, the peripheral spacer SEe may present a top-view outline of mesh interweaving. The peripheral spacers SEa, SEb, SEc, SEd, and SEe may enhance the structural support of the fingerprint sensing device to maintain a stable spacing of the spacer layer.

To sum up, the fingerprint sensing device of this disclosure may avoid crushing of the micro-structure by disposing the main spacers on the dummy structures, and at the same time keep the spacing between the spacer layer stable, so as to stabilize the regulation of the light acceptance angle and optical focus, and thus improve the sensing resolution of the fingerprint sensing device. In addition, the fingerprint sensing device of the disclosure may assist in maintaining a stable spacing of the spacer layer by disposing the sub-spacers, and at the same time provide a suitable pressing buffer space for the fingerprint sensing device. Furthermore, the fingerprint sensing device of the disclosure may further increase the spacing of the spacer layer by disposing the bumps, thereby improving the light collimation effect.

It will be apparent to those skilled in the art that various modifications and variations can be made to the disclosed embodiments without departing from the scope or spirit of the disclosure. In view of the foregoing, it is intended that the disclosure covers modifications and variations provided that they fall within the scope of the following claims and their equivalents.

What is claimed is:

1. A fingerprint sensing device comprising:
a first substrate;
a sensing element layer located on the first substrate and comprising a plurality of sensing elements;
a second substrate located on the sensing element layer;
a micro-structure layer located between the second substrate and the sensing element layer, and comprising a plurality of micro-lens structures and a plurality of dummy structures, wherein orthogonal projections of the micro-lens structures on the first substrate respectively overlap orthogonal projections of the sensing elements on the first substrate; and
a spacer layer located between the second substrate and the sensing element layer, and comprising a plurality of main spacers, wherein each of the main spacers covers at least one of the dummy structures.

2. The fingerprint sensing device according to claim 1, wherein the micro-structure layer and the spacer layer are disposed on the first substrate.

3. The fingerprint sensing device according to claim 1, wherein the micro-structure layer and the spacer layer are disposed on the second substrate.

4. The fingerprint sensing device according to claim 1, wherein a height of the main spacer is greater than 10 µm.

5. The fingerprint sensing device according to claim 1, wherein the spacer layer further comprises a plurality of bumps, and the main spacers are located between the bumps and the dummy structures.

6. The fingerprint sensing device according to claim 1, wherein the spacer layer further comprises a plurality of sub-spacers, each of the sub-spacers covers at least one of the dummy structures, and a height of the plurality of sub-spacers is smaller than a height of the plurality of main spacers.

7. The fingerprint sensing device according to claim 6, wherein the spacer layer further comprises a plurality of bumps, and the main spacers and the sub-spacers are respectively located between the bumps and the dummy structures.

8. The fingerprint sensing device according to claim 1, wherein an orthogonal projection of the plurality of dummy structures on the first substrate is outside the orthogonal projections of the sensing elements on the first substrate.

9. The fingerprint sensing device according to claim 1 further comprising a light shielding layer located between the sensing element layer and the micro-structure layer.

10. The fingerprint sensing device according to claim 9, wherein the light shielding layer has a plurality of openings, and orthogonal projections of the openings on the first substrate respectively overlap the orthogonal projections of the sensing elements on the first substrate.

11. The fingerprint sensing device according to claim 1, wherein the spacer layer further comprises a peripheral spacer.

12. A fingerprint sensing device comprising:
a first substrate;
a sensing element layer located on the first substrate and comprising a plurality of sensing elements;
a second substrate located on the sensing element layer;
a micro-structure layer located between the second substrate and the sensing element layer, and comprising a plurality of micro-lens structures and a plurality of dummy structures; and
a spacer layer located on one side of the micro-structure layer, and comprising a plurality of main spacers and a plurality of sub-spacers, wherein each of the main spacers and each of the sub-spacers respectively overlap at least one of the dummy structures, and a height of the sub-spacer is smaller than a height of the main spacer.

13. The fingerprint sensing device according to claim 12, wherein the micro-structure layer is disposed on the first substrate, and the spacer layer is disposed on the second substrate.

14. The fingerprint sensing device according to claim 12, wherein the micro-structure layer is disposed on the second substrate, and the spacer layer is disposed on the first substrate.

15. The fingerprint sensing device according to claim 12, wherein orthogonal projections of the micro-lens structures on the first substrate respectively overlap orthogonal projections of the sensing elements on the first substrate.

16. The fingerprint sensing device according to claim 15, wherein an orthogonal projection of the plurality of dummy structures on the first substrate is outside the orthogonal projections of the sensing elements on the first substrate.

17. The fingerprint sensing device according to claim 12, wherein the second substrate is a color filter substrate.

* * * * *